United States Patent [19]

Ikeda et al.

[11] Patent Number: 5,745,314
[45] Date of Patent: Apr. 28, 1998

[54] CLOCK GENERATING CIRCUIT BY USING THE PHASE DIFFERENCE BETWEEN A BURST SIGNAL AND THE OSCILLATION SIGNAL

[75] Inventors: Shingo Ikeda; Shinichi Yamashita, both of Kanagawa-ken, Japan

[73] Assignee: Canon Kabushiki Kaisha, Tokyo, Japan

[21] Appl. No.: 299,811

[22] Filed: Sep. 1, 1994

Related U.S. Application Data

[63] Continuation of Ser. No. 71,328, Jun. 2, 1993, abandoned, which is a continuation of Ser. No. 585,474, Sep. 20, 1990, abandoned.

[30] Foreign Application Priority Data

Sep. 27, 1989 [JP] Japan ................................. 1-251290
Oct. 2, 1989 [JP] Japan ................................. 1-258349
Oct. 2, 1989 [JP] Japan ................................. 1-258350

[51] Int. Cl.$^6$ ................................................ G11B 5/09
[52] U.S. Cl. .................. 360/51; 386/13; 386/85; 331/20
[58] Field of Search ................................ 360/33.1, 9.1, 360/27–30, 51; 358/319–320, 324, 326; 331/11, 2, 20, 18, 50; 329/325; 348/541; 386/12, 13, 84, 85, 16, 17, 19, 20, 88, 90; 327/147–150

[56] References Cited

U.S. PATENT DOCUMENTS

| | | | |
|---|---|---|---|
| 3,815,042 | 6/1974 | Maunsell et al. | 331/11 |
| 4,092,672 | 5/1978 | Aschwaden | 348/541 |
| 4,380,743 | 4/1983 | Underhill et al. | 331/1 A |
| 4,613,827 | 9/1986 | Takamori et al. | 388/319 |
| 4,675,724 | 6/1987 | Wagner | 358/320 |
| 4,680,651 | 7/1987 | Blessinger | 360/51 |
| 4,692,914 | 9/1987 | Yasumura et al. | 369/49 |
| 4,812,783 | 3/1989 | Honjo et al. | 331/20 |
| 5,142,420 | 8/1992 | Tanaka et al. | 360/51 |

FOREIGN PATENT DOCUMENTS 0267035  5/1988  European Pat. Off. ................. 360/57

*Primary Examiner*—Aristotelis M. Psitos
*Assistant Examiner*—Larry T. Cullen
*Attorney, Agent, or Firm*—Robin, Blecker & Daley

[57] ABSTRACT

A circuit for generating a clock of a predetermined frequency in following-up relation to an input video signal, comprising a PLL circuit including a phase comparison circuit for comparing the phase of a synchronizing signal of the video signal with the phase of a feedback clock corresponding to the clock, and a control circuit for causing the feedback clock in the PLL circuit to be synchronized with the synchronizing signal.

12 Claims, 6 Drawing Sheets

CLOCK GENERATING CIRCUIT BY USING THE PHASE DIFFERENCE BETWEEN A BURST SIGNAL AND THE OSCILLATION SIGNAL

This is a continuation application under 37 CFR 1.62 or prior application Ser. No. 08/071,328 filed on Jun. 2, 1993 now abandoned which is a cont. of Ser. No. 07/585,474 filed on Sep. 20, 1990 (aban.)

BACKGROUND OF THE INVENTION

1. Field of the Invention

This invention relates to a device receptive of a video signal containing jitter for removing the jitter component.

2. Description of the Related Art

As the method of depriving the jitter-contained video signal of the jitter component, there has been a digital TBC (Time Base Corrector). For example, a clock that follows the jitter of the video signal is used for sampling the video signal when it is converted into a digital signal. After having been stored in a memory, the digital data are read by a stabilized constant clock and converted into the analog signal again. Thus, a video signal which does not contain the jitter component is obtained.

Here, to get the clock that follows the jitter of the jitter-contained video signal, the arrangement of FIG. 1 has been employed up to now. In the following, FIG. 1 is explained.

The jitter-contained video signal enters an input terminal 1. The video signal includes a horizontal synchronizing signal and a burst signal. A synchronizing signal separation circuit 2 separates the horizontal synchronizing signal and the burst signal, putting the horizontal synchronizing signal on an output signal line 3 and the burst signal on another output signal line 4. In the present case, the clock is generated in phase-locked relation to the horizontal synchronizing signal and its frequency is the same as that of the burst signal. That clock is compared with the burst signal to detect the phase difference (under the condition of ±180° within one period of the burst signal). The phase of the clock is shifted by this phase difference so that it coincides with the phase of the burst signal. After this, a clock of frequency necessary for the A/D conversion is obtained by a frequency multiplier circuit 13 to be described later. Elements 5, 6, 7 and 8 constitute a PLL circuit for producing the clock which is phase-locked to the horizontal synchronizing signal and has the same frequency as that of the burst signal. These are a phase comparison circuit 5, a loop filter 6, a VCO 7 and an N frequency dividing counter 8. The phase difference between the phase-locked clock to the horizontal synchronizing signal and the burst signal is detected by a phase comparison circuit 9 which produces its output representing the amount of phase difference onto the signal line 10. It is to be noted that the detection is ±180° within one period of the burst signal. Based on the phase difference from the signal line 10, a phase shifting circuit 11 shifts the phase of the clock generated by the VCO 7. Thus, a clock which coincides in phase with the burst signal and has the same frequency as that of the burst signal is output to a signal line 12. An M multiplier circuit 13 produces a clock necessary for sampling the video signal. Thus, the clock that follows the jitter of the video signal is output from an output terminal 14.

However, in the above-described conventional example, if the video signal is the output of the helical scan type VTR, the PLL circuit that generates the clock which is phase-locked to the horizontal synchronizing signal and has the same frequency as that of the burst signal falls temporarily into disorder at the switching point where the head is changed over, because an error arises in the time from the horizontal synchronizing signal just before the head changes over to the first horizontal synchronizing signal after the head changes over. For this reason, in such a conventional example as has been described above, there is a drawback that just after the switching point, the clock output becomes unstable.

Also, in the above-described conventional example, if the horizontal synchronizing signal and the burst signal differ in phase at a lower frequency component than the frequency of the horizontal synchronizing signal, detection of the phase difference in the phase comparison circuit 9 does not operate in a range of ±180° of the burst period for the jitter, but is one-sided to either plus or minus. Therefore, the range of detection of the jitter component becomes narrow. Thus, there is another drawback of decreasing the range of ability to remove the jitter.

Further, as another circuit for generating the clock that follows the jitter of the video signal, there has been known the circuit arrangement shown in FIG. 2. The jitter-contained video signal enters an input terminal 15. This video signal, as shown in FIG. 3, includes the horizontal synchronizing signal and the burst signal. The synchronizing signal separation circuit 16 separates the horizontal synchronizing signal and the burst signal out of the video signal from the input terminal 15, supplying the separated horizontal synchronizing signal 16A to the PLL circuit 17, while simultaneously supplying the separated burst signal 16B to the phase comparison circuit 18. The PLL circuit 17 forms the clock which is phase-locked to the separated horizontal synchronizing signal 16A and has the same frequency as that of the burst signal, and outputs that clock. The phase comparison circuit 18 compares the phases of the output of the PLL circuit 17 and the burst signal 16B from the synchronizing signal separation circuit 16. The level of the output of the phase comparison circuit 18 is adjusted by a level converting circuit 19. Based on the phase difference signal supplied from the phase comparison circuit 18 through the level converting circuit 19, a phase shifting circuit 20 shifts the phase of the clock output from the PLL circuit 17. By this, the clock, which coincides in phase with the burst signal 16B and has the same frequency, is obtained. An M multiplier circuit 21 converts the output of the phase shifting circuit 20 into a signal of M times as high as its frequency. Thus, the sampling clock to be used in A/D conversion when the video signal is written in the memory, is obtained.

It should be noted that in each of the above-described conventional examples, the measure of only bringing the clock to phase coincidence with the horizontal synchronizing signal does not ensure an adequate accuracy of detection of the horizontal synchronizing signal, so the error is large. Therefore, this error is usually removed by coinciding the phase of the clock with the phase of the burst signal.

It should also be noted that, in the conventional example shown in FIG. 2, the PLL circuit 17 is similar to the PLL circuit shown in FIG. 1. But, in this conventional example, the input/output characteristics of the phase shifting circuit 20 and the phase comparison circuit 18 differ from each other. To absorb that difference, the level converting circuit 19 becomes necessary. Between the clock output from the phase shifting circuit 20 and the burst signal, therefore, there exists a phase error depending on the accuracy of conversion of the level converting circuit 19. Particularly when the input/output characteristics of the phase shifting circuit 20 and the phase comparison circuit 18 are not linear, the level converting circuit 19 has to be constructed in a very complicated form, and the conversion accuracy also becomes worse. There is yet another problem arising from the complicated structures of construction of the phase shifting circuit 20 and the M multiplier circuit 21.

SUMMARY OF THE INVENTION

With such situations as have been described above in mind, the present invention has been made and its first object is to provide a clock generating circuit which is not susceptible to the influence of the variation of the period of reproduced output of the horizontal synchronizing signal at the head switching point.

According to the invention, in an embodiment thereof, to achieve the above-described object, the circuit for generating a clock of predetermined frequency in following-up relation to the input video signal is provided with a PLL circuit including phase comparing means for comparing the phase of the synchronizing signal in the aforesaid video signal with the phase of a feedback clock taken from the aforesaid clock, and control means for causing the aforesaid feedback clock in this PLL circuit to be synchronized with the aforesaid synchronizing signal.

With the clock generating circuit of such construction as described above, the feedback clock in the PLL circuit is controlled so as to be synchronized with the varying synchronizing signal.

By this, even when the timing of the synchronizing signal to be supplied to the aforesaid PLL circuit has changed, the PLL circuit does not fall into disorder due to this change of the synchronizing signal.

Another or second object of the invention is to provide a clock generating circuit which is able to remove the jitter, particularly, of low frequency.

According to the invention, in another embodiment thereof, to achieve this second object, the clock generating circuit is provided with a PLL circuit having phase comparing means for comparing the phase of the synchronizing signal in the input video signal with the phase of a clock corresponding to this synchronizing signal, and phase difference detecting means for detecting the phase difference in the low-frequency component between the burst signal of the aforesaid video signal and the output of the aforesaid PLL circuit, wherein the output of the phase difference detecting means is added to the output of the aforesaid phase comparing means.

With this embodiment in use, the phase difference between the horizontal synchronizing signal and that component of the burst signal which has a lower frequency than the frequency of the horizontal synchronizing signal of the video signal, (or the jitter), is removed in the PLL circuit that generates the clock which is phase-locked to the synchronizing signal and has the same frequency as that of the burst signal, thereby making it possible to remove the fundamental jitter by detecting the jitter component in a range of ±180° within one period of the burst signal frequency.

Still another or third object of the invention is to provide a clock generating circuit of high accuracy of conversion and simple form of construction.

According to the invention, in still another embodiment thereof, the clock generating circuit produces a clock of predetermined frequency in following-up relation to the input video signal, comprising first phase comparing means for comparing the phase of a synchronizing signal of the input video signal with the phase of a clock corresponding to a desired clock signal, second phase comparing means for comparing the phase of the synchronizing signal of the input video signal with the phase of a burst signal of the input video signal, adding means for adding outputs of the first and second phase comparing means, and oscillation means arranged to oscillate at a frequency corresponding to an output of the adding means.

In such an embodiment, the first phase comparing means and the oscillation means constitute a PLL circuit. Therefore, in the condition that the output of the second phase comparing means is zero, the output of this PLL circuit becomes a clock signal which is synchronized in phase with the synchronizing signal of the input video signal. But, in response to the level of the output of the second phase comparing means, the phase of the output of the PLL circuit is shifted, finally becoming synchronous with the phase of the burst signal of the input video signal.

Other objects of the invention and its features will become apparent from the following description by reference to the drawings.

DETAILED DESCRIPTION OF THE PREFERRED EMBODIMENTS

Figure 4:
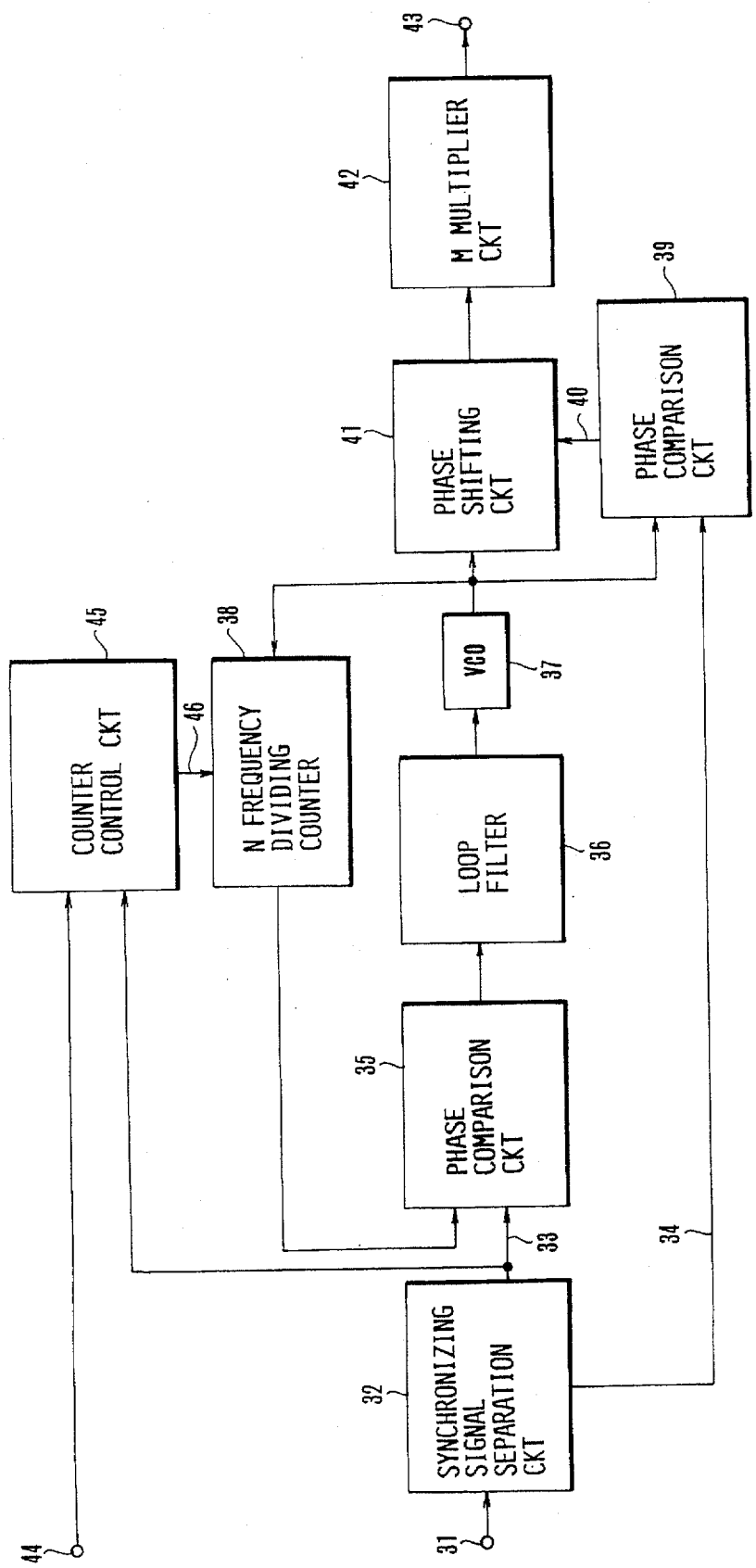
FIG. 4 is a block diagram of an embodiment of the invention.

FIG. 4 is a diagram of a constructional feature in an embodiment of the invention. In the following, by reference to FIG. 4, the features of the embodiment are described.

A video signal containing the jitter enters an input terminal 31. The video signal includes a horizontal synchronizing signal and a burst signal. A synchronizing signal separation circuit 32 separates the horizontal synchronizing signal and the burst signal, putting the horizontal synchronizing signal on a signal line 33 and the burst signal on a signal line 34. Elements 35, 36, 37 and 38 constitute a PLL circuit for generating a clock which is phase-locked to the horizontal synchronizing signal and has the same frequency as that of the burst signal. These are a phase comparison circuit 35, a loop filter 36, a voltage-controlled oscillator (VCO), and an N frequency dividing counter 38. A phase comparison circuit 39 detects the phase difference between the clock which is phase-locked to the horizontal synchronizing signal and the burst signal in a range of ±180°, and produces an output representing the amount of that phase difference on a signal line 40. A phase shifting circuit 41 shifts the phase of the clock generated by the VCO 37 according to the phase difference from the phase comparison circuit 39.

An M multiplier circuit 42 produces a clock necessary for sampling the video signal. At an output terminal 43, the clock that follows up the jitter of the video signal is obtained.

Figure 5A:
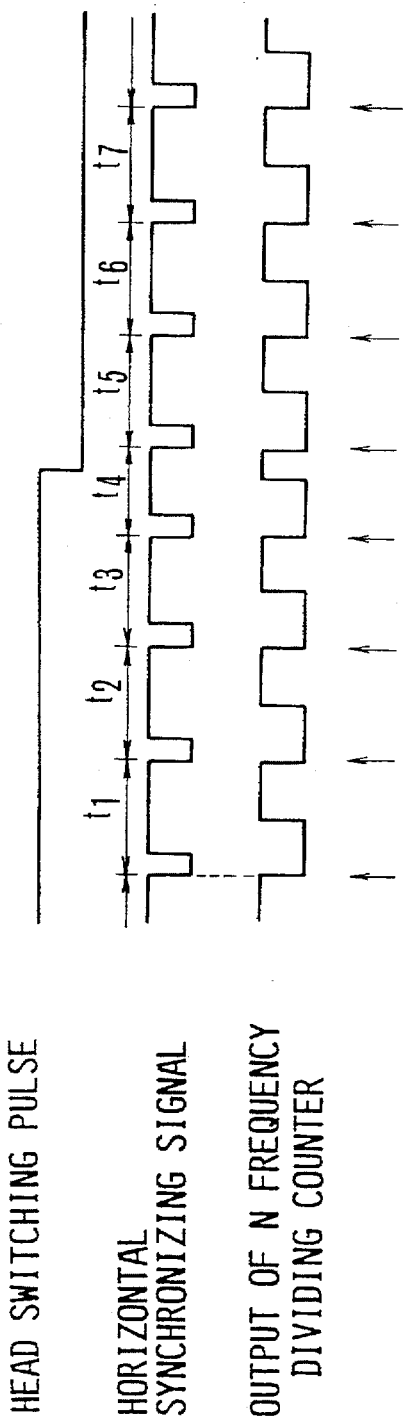
FIG. 5(a) and FIG. 5(b) are timing charts of the invention.
Figure 5B:
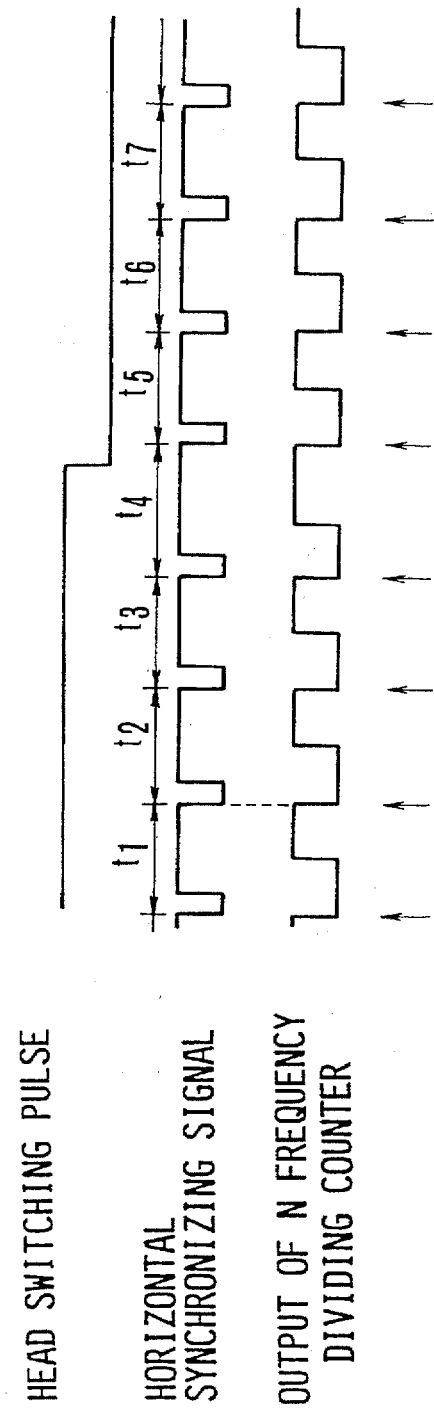

Assuming here that the video signal is the output of the helical scan type VTR, then there are occasions that the head switching pulse and the horizontal synchronizing signal fall in relationships shown in FIG. 5(a) and FIG. 5(b). In FIG. 5(a), $t_1 \cong t_2 \cong t_3 \cong t_5 \cong t_6 \cong t_7 \cong ta \cong ta > t_4$ occurs, while in FIG. 5(b), $t_1 \cong t_2 \cong t_3 \cong t_5 \cong t_6 \cong tb \cong tb < t_4$ occurs.

Figure 1:
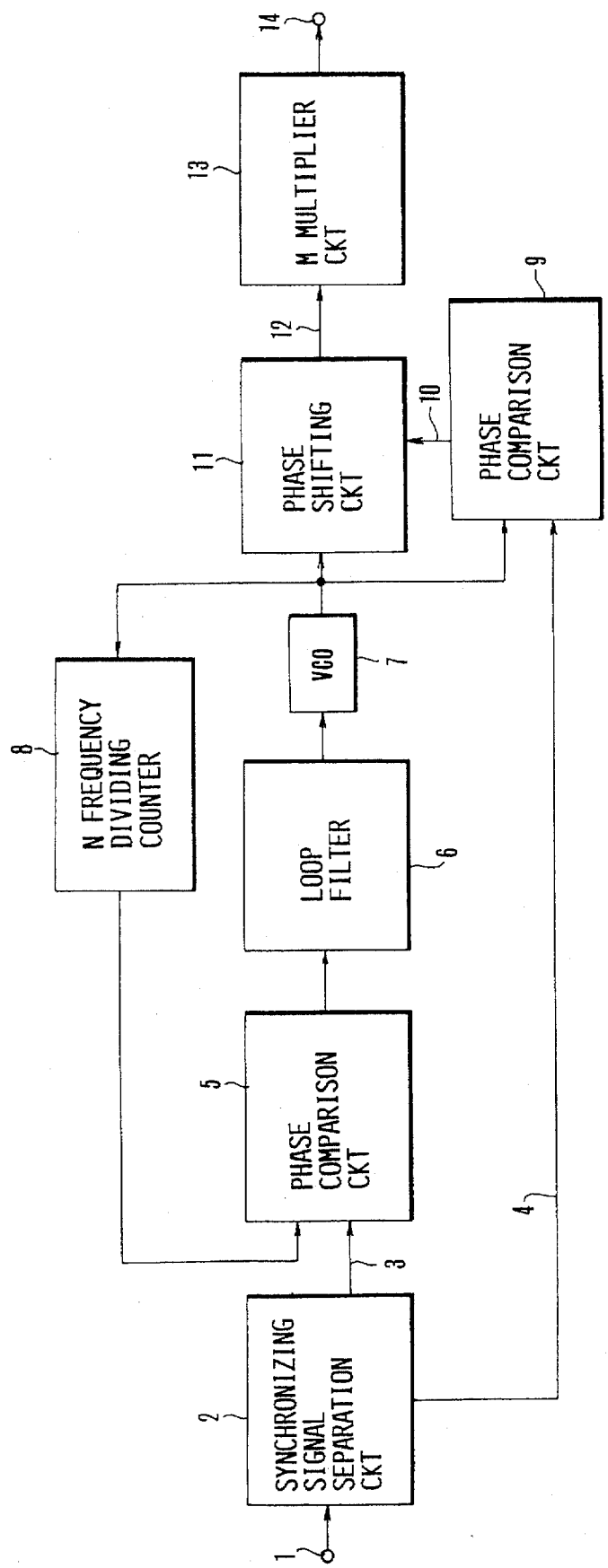
FIG. 1 is a block diagram illustrating the construction of a conventional example.
Figure 2:
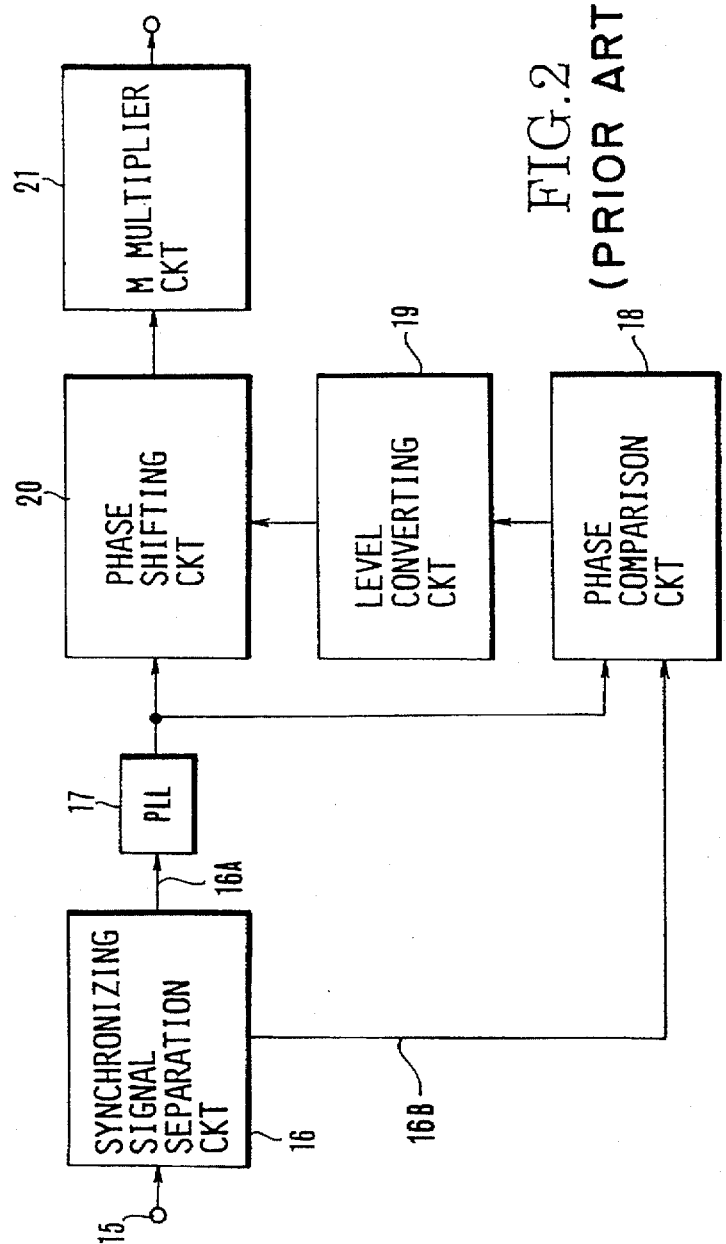
FIG. 2 is a block diagram of the construction of another conventional example.
Figure 3:
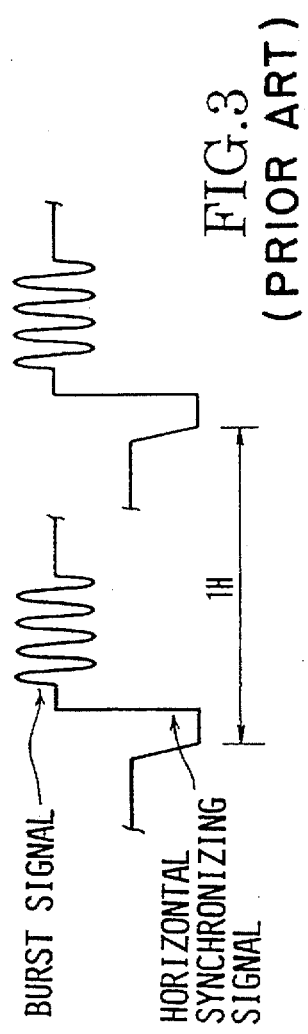
FIG. 3 is a wave form of the video signal.

Suppose the clock is produced by using the conventional circuit of the example shown in FIG. 1, the output period of the horizontal synchronizing signal is disturbed, and then the output of the phase comparison circuit 5 in FIG. 1 changes rapidly at the head switching point. Therefore, the PLL circuit composed of the elements 5, 6, 7 and 8 goes out of order for a while, so that the clock becomes unstable.

For this reason, in the present embodiment, use is made of a counter control circuit 45 as shown in FIG. 4 to control the timing in which the N frequency dividing counter 38 produces an output. The counter output synchronized with the horizontal synchronizing signal as shown in FIG. 5(a) and FIG. 5(b) is thus obtained. By this, even if the output period of the horizontal synchronizing signal changes at the head switching point, the aforesaid counter output is permitted to follow up that change. Therefore, the output of the phase comparison circuit 35 is prevented from rapidly changing at the head switching point. So, a stable clock can be obtained. Incidentally, the points of measurement of the phase comparison circuit 35 are taken as shown by arrows in FIG. 5(a) and FIG. 5(b), namely, coinciding with the falling edges of the horizontal synchronizing signal and the falling edges of the output of the N frequency dividing counter 38.

The counter control circuit 45 and the N frequency dividing counter 38 are described below. The counter control circuit 45 is supplied with switching pulses from an input terminal 44 and with the horizontal synchronizing signal from the synchronizing signal separation circuit 32. From these two signals, the counter control circuit 45 detects those portions of the horizontal synchronizing signal which occur ahead and behind the point at which the head is changed over. Regardless of the largeness or smallness of the time interval (period) $t_4$ (FIGS. 5(a) and 5(b)) between these moments, the output of the N frequency dividing counter 38 is synchronized with the horizontal synchronizing signal before and after the switching point. For this purpose, a control signal 46 is produced by the counter control circuit 45.

In such a manner, in the present embodiment, the timing of output of the N frequency dividing counter 38 in the PLL circuit for generating the clock, which is phase-locked to the horizontal synchronizing signal at the switching point and has the same frequency as that of the burst signal, is controlled so as to be synchronized with the horizontal synchronizing signal, thereby making it possible to obtain a stable clock.

As has been described above, in the PLL circuit for generating the clock, which is phase-locked to the synchronizing signal in the video signal and which has a predetermined frequency, the feedback clock is controlled so as to be synchronized with the aforesaid synchronizing signal. With this, even when the aforesaid video signal is the reproduced signal of the helical scan type VTR and the reproduced output period of the synchronizing signal changes at the switching point of the head, a stable clock can always be obtained.

Another embodiment of the invention is next described.

Figure 6:
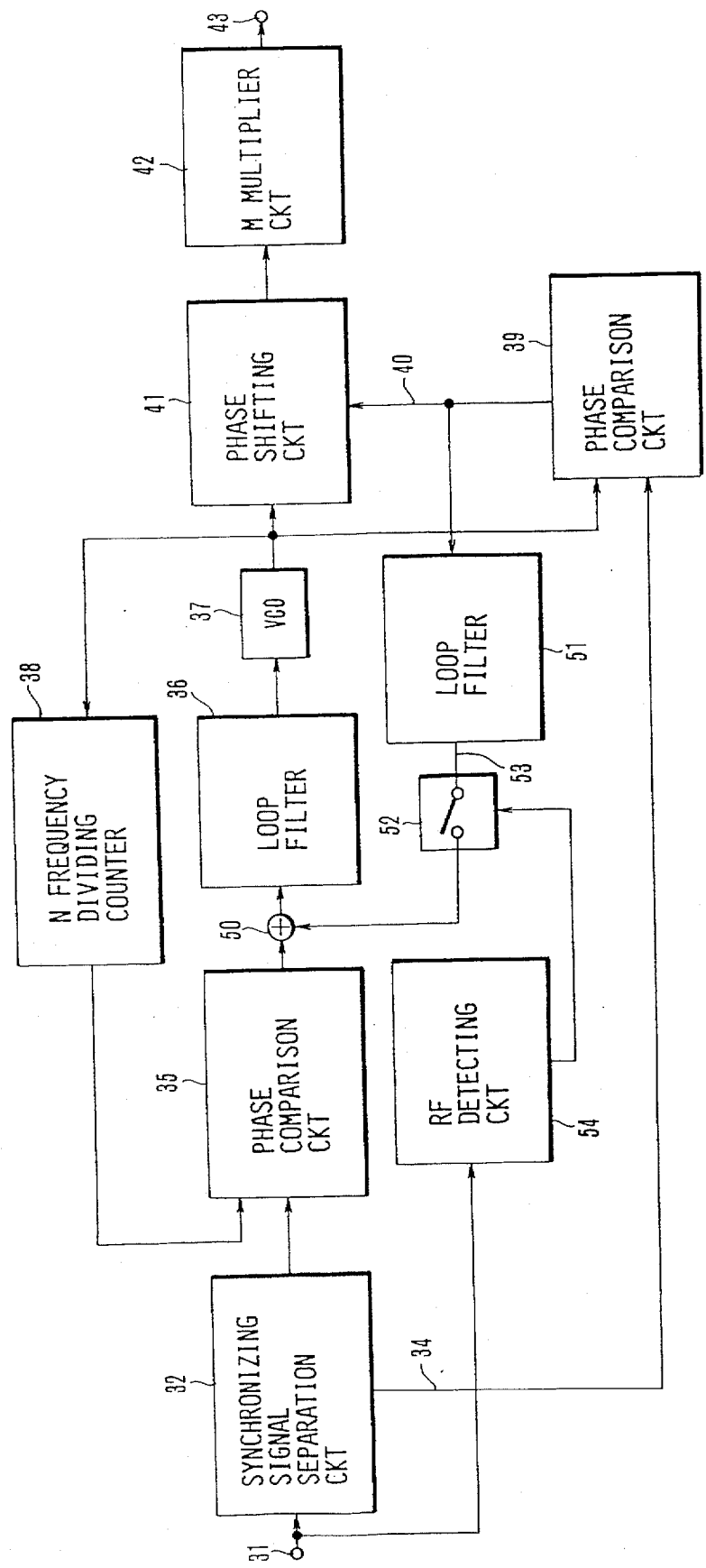
FIG. 6 is a block diagram illustrating another embodiment of the invention.

FIG. 6 is a diagram of the construction in another embodiment of the invention. In the following, by reference to FIG. 6, the features of this embodiment are explained.

Incidentally, the similar circuits or parts to those of the foregoing embodiment are denoted by the same reference numerals.

The jitter-contained video signal entering at the input terminal 31 includes the horizontal synchronizing signal and the burst signal. The synchronizing signal separation circuit 32 separates the horizontal synchronizing signal and the burst signal which are output to the signal lines 33 and 34, respectively. The phase comparison circuit 35, the loop filter 36, the VCO 37 and the N frequency dividing counter 38 constitute the PLL circuit for generating the clock which is phase-locked to the horizontal synchronizing signal and has the same frequency as that of the burst signal. The second phase comparison circuit 39 detects the phase difference between the clock which is phase-locked to the horizontal synchronizing signal and the burst signal in a range of ±180°, and produces the output representing the amount of that phase difference, which is output to the signal line 40. The phase shifting circuit 41 shifts the phase of the clock produced by the VCO 37 by an amount depending on the phase difference supplied from the signal line 40. The M multiplier circuit 42 produces a clock necessary for sampling the video signal. The clock that follows up the jitter of the video signal is obtained at the output terminal 43.

Here, suppose the horizontal synchronizing signal and the burst signal differ in phase from each other at components of lower frequencies than that of the horizontal synchronizing signal, then a loop filter 51 receives the signal 40 representing that phase difference to cause only the component of sufficiently lower frequency than that of the horizontal synchronizing signal to pass therethrough. Its output 53 is supplied through a switch 52 to an adder 50.

By using the adder 50 arranged between the phase comparison circuit 35 of the PLL circuit composed of the elements 35, 36, 37 and 38 and the loop filter 36, the phase between the horizontal synchronizing signal and the output clock of the VCO 37 is made variable as a function of the level of output of the aforesaid loop filter 51. Therefore, it means that the phase difference between the horizontal synchronizing signal and the burst signal at the components of sufficiently lower frequencies than the frequency of the horizontal synchronizing signal of a video signal is removed by the PLL circuit composed of the elements 35, 36, 37 and 38.

An RF detecting circuit 54 turns off the switch 52 when the video signal level is below a predetermined value. This is because the PLL circuit composed of the elements 35, 36, 37 and 38 is prevented from falling in a faulty operation when the video signal level is not stable.

It will be appreciated from the above description that according to the present embodiment, the jitter component of low frequency is detected in a range of ±180° within one period of the burst signal so the jitter of low frequency can be removed. Thereby, a sampling clock for removing the fundamental jitter of the video signal can be obtained.

As has been described above, according to the present embodiment, even if there is any phase difference between the synchronizing signal and the burst signal of the jitter-contained video signal at components of sufficiently lower frequency than that of the horizontal synchronizing signal, this can be removed. Accordingly, the range for removing the fundamental jitter can be kept always maximum.

Figure 7:
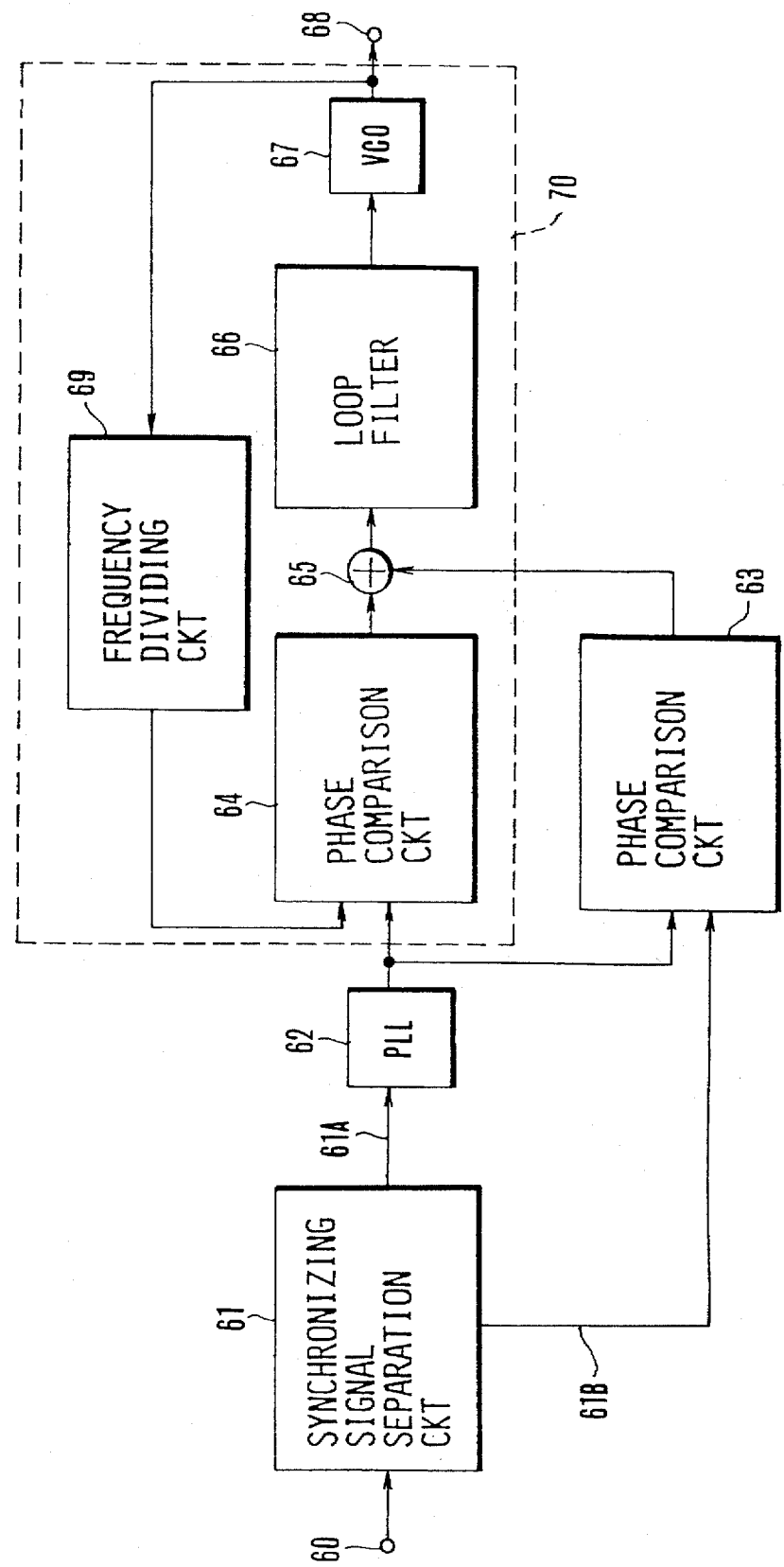
FIG. 7 is a block diagram of the construction of still another embodiment of the invention.

Referring next to FIG. 7, a further embodiment of the invention is described.

FIG. 7 is a block diagram of the construction of a further embodiment of the circuit according to the invention. The video signal enters at an input terminal 60. The horizontal synchronizing signal and the burst signal of the video signal are separated out of the video signal by a synchronizing signal separation circuit 61. In phase-synchronism with the horizontal synchronizing signal 61A separated by the synchronizing signal separation circuit 61, a PLL circuit 62 produces a clock of the same frequency as that of the burst signal. A phase comparison circuit 63 compares the phase of the output of the PLL circuit 62 with the phase of the burst signal 61B separated by the synchronizing signal separation circuit 61. Another phase comparison circuit 64 compares the phase of the output clock of the PLL circuit 62 with the phase of a clock obtained by dividing by N the frequency of a desired clock signal. These two phase comparison circuits 63 and 64 are similar in internal construction and have a similar input-output characteristic to each other.

The outputs of the phase comparison circuits 63 and 64 are added by an adder 65. A loop filter 66 has a sufficient gain in a low frequency band. A voltage-controlled oscillator (VCO) 67 has a clock output terminal 68. A frequency dividing circuit 69 divides the frequency of the output clock of the VCO 67 by N and produces an output which is supplied to one of the inputs of the phase comparison circuit 64.

It is to be noted that the phase comparison circuits 63 and 64 may be of different form from each other, provided that almost the same input-output characteristic is obtained. Again, this may be so even if their input-output characteristics differ from each other in the initial state, provided they can later be adjusted to almost the same one.

Next, the operation of the circuit of FIG. 7 is described. The synchronizing signal separation circuit 61, the PLL circuit 62 and the phase comparison circuit 63 operate similarly to the conventional examples. The loop of the phase comparison circuit 64, the loop filter 66, the VCO 67 and the frequency dividing circuit 69, constituting a PLL circuit 70, is adjusted so that when the output of the adder 65 is zero, a desired clock of predetermined frequency is obtained at the output terminal 68 (or the output of the VCO 67).

Here, when the output voltage of the phase comparison circuit 63 is $V_1$, the PLL circuit 70 locks the phase so that the phase comparison circuit 64 produces an output voltage of $-V_1$. This means that in the case where the phase comparison circuit 64 has the same characteristic as that of the phase comparison circuit 63, the phase difference between the two inputs of the phase comparison circuit 64 is equal in the absolute value to, but different only in sign from, the phase difference between the two inputs of the phase comparison circuit 63. In other words, when the output clock of the PLL circuit 62 differs in phase from the burst signal 61B by $\phi$, the phase difference of the output clock of the frequency dividing circuit 69 from the output clock of the PLL circuit 62 becomes $-\phi$. That is, the burst signal 61B and the output clock of the frequency dividing circuit 69 have the same phase.

In such a manner, the clock that follows up the jitter-contained video signal is obtained at the output terminal 68.

Though, in the present embodiment, the phase locking has been made to the burst signal frequency, the phase locking may be made to the horizontal synchronizing signal.

As is easily understandable from the foregoing description, according to the invention, with a very simple form, the clock signal that follows up the jitter-contained video signal can be obtained. Also, when manufacturing the circuit, adjusting elements, too, though few, are sufficient. Nevertheless a high accuracy can be obtained with ease.

What is claimed is:

1. A clock generating circuit for generating a clock of a predetermined frequency corresponding to a video signal, comprising:

video input means for inputting the video signal and obtaining a synchronizing signal and a burst signal from the input video signal;

a PLL circuit including phase comparing means for generating a phase comparing signal, oscillation means for generating an oscillation signal, as the clock, having a frequency corresponding to the burst signal of the video signal according to the phase comparing signal, and a counter for counting the oscillation signal and for outputting a counted signal according to a counting result of the oscillation signal, said phase comparing means comparing a phase of the synchronizing signal obtained by said video input means and a phase of the counted signal output from the counter to generate the comparing signal indicating a phase difference between the synchronizing signal and the counted signal;

phase difference detection means for detecting a phase difference between the burst signal obtained by said video input means and the oscillation signal to output a detection signal; and adding means for adding the detection signal and the phase comparing signal, said oscillation means generating the oscillation signal according to an output of said adding means.

2. A circuit according to claim 1, wherein said phase comparing means comprises a phase comparison circuit, said oscillation means comprises an oscillator and said counter comprises a frequency divider for dividing the frequency of an output of said oscillator, and wherein said phase comparison means comprises a phase comparison circuit which produces a signal corresponding to a phase difference between said synchronizing signal and an output of said frequency divider for input to said oscillator.

3. A circuit according to claim 1, wherein said synchronizing signal is a horizontal synchronizing signal.

4. A clock generating apparatus, comprising:

input means for inputting a video signal and separating a horizontal synchronizing signal and a burst signal from the input video signal;

a PLL circuit including phase comparing means for generating a phase comparing signal, oscillator means for generating an oscillation signal, as a clock signal, having a frequency corresponding to the burst signal of the video signal according to the phase comparing signal, and a counter for counting the oscillation signal and for outputting a counted signal according to a counting result of the oscillation signal, said phase comparing means comparing a phase of the synchronizing signal separated by said input means and a phase of the counted signal output from the counter to generate the comparing signal indicating a phase difference between the synchronizing signal and the counted signal;

phase difference detection means for detecting a phase difference between the burst signal separated by said input means and the oscillation signal to output a phase detection signal;

low-frequency detection means for detecting a low-frequency component of the phase detection signal; and adding means for adding the low frequency component of the phase detection signal detected by said low-frequency detection means and the phase comparing signal, said oscillation means generating the oscillation signal according to an output of said adding means.

5. A circuit according to claim 4, wherein said low-frequency detection means comprises a filter circuit.

6. A circuit according to claim 5, wherein said phase difference detecting means further includes switch control means for turning on or off an output of said filter circuit according to the level of said video signal.

7. A circuit according to claim 6, wherein said switch control means includes a switch circuit arranged between said filter circuit and said PLL circuit, and a control circuit for controlling an operation of said switch circuit by detecting the level of said video signal.

8. A clock generating device for generating a clock phase-synchronized with a video signal, comprising:

input means for inputting a video signal and detecting a horizontal synchronizing signal and a burst signal of the input video signal;

first PLL means for inputting the horizontal synchronizing signal detected by said input means and to output a first signal having a frequency corresponding to the burst signal;

phase comparing means for comparing a phase of the burst signal detected by said input means and a phase of the first signal to output a comparison signal indicating a phase difference between the burst signal and the first signal; and second PLL means for inputting the first signal and to output a second signal as the clock, said second PLL means having a phase detection means for detecting a phase difference between the first signal and the second signal to output a phase detection signal, adding means for adding the phase detection signal and the comparison signal to output a control signal and an oscillation means for generating the second signal according to the control signal.

9. A clock generating apparatus comprising:

a first PLL circuit for receiving an input signal to output a clock synchronized with the input signal;

a second PLL circuit connected in series with the first PLL circuit and arranged to receive the output clock from the first PLL circuit; and control means for receiving the output clock which is supplied to the second PLL circuit and the input signal which is supplied to the first PLL circuit to control the second PLL circuit on the basis of the received output clock signal and the received input signal.

10. A circuit according to claim 9, wherein said second PLL circuit includes a phase comparison circuit for producing an oscillation control signal corresponding to a phase difference between the output clock of said first PLL circuit and a feedback clock, an adder for adding said control signal to said oscillation control signal, and an oscillator whose oscillation is controlled by an addition output of said adder.

11. A circuit according to claim 9, wherein said input signal includes a synchronizing signal included in a video signal.

12. A circuit according to claim 9, wherein said input signal includes a horizontal synchronizing signal and a burst signal included in a video signal, said horizontal synchronizing signal being input to said first PLL circuit, and said burst signal being input to said second PLL circuit.

* * * * *